(12) United States Patent
Ucar

(10) Patent No.: US 8,354,874 B1
(45) Date of Patent: Jan. 15, 2013

(54) KICKBACK CANCELLATION IN CLASS B TYPE CIRCUITS USING AC COUPLING

(75) Inventor: Talip Ucar, San Francisco, CA (US)

(73) Assignee: Marvell International Ltd., Hamilton (BM)

( * ) Notice: Subject to any disclaimer, the term of this patent is extended or adjusted under 35 U.S.C. 154(b) by 185 days.

(21) Appl. No.: 12/778,248

(22) Filed: May 12, 2010

Related U.S. Application Data

(60) Provisional application No. 61/178,696, filed on May 15, 2009.

(51) Int. Cl.
*H03K 17/56* (2006.01)

(52) U.S. Cl. ......... 327/427; 327/108; 327/112; 327/475

(58) Field of Classification Search .................. 327/141, 327/108–112, 379, 389, 391, 144–163; 326/22–27, 326/81–87; 331/1/A, 15–17; 375/373–376
See application file for complete search history.

(56) References Cited

U.S. PATENT DOCUMENTS

| | | | |
|---|---|---|---|
| 6,346,829 B1 * | 2/2002 | Coddington | 326/81 |
| 6,586,976 B2 * | 7/2003 | Yang | 327/157 |
| 6,856,178 B1 * | 2/2005 | Narayan | 327/108 |
| 7,015,736 B1 * | 3/2006 | Sudjian et al. | 327/157 |
| 7,034,574 B1 * | 4/2006 | Li | 326/83 |
| 7,269,834 B2 * | 9/2007 | Tsutsumi et al. | 720/630 |
| 7,741,874 B2 * | 6/2010 | Nedalgi | 326/83 |
| 7,915,933 B2 * | 3/2011 | Vlasenko et al. | 327/157 |
| 7,999,523 B1 * | 8/2011 | Caffee et al. | 323/271 |
| 2002/0089382 A1 * | 7/2002 | Yang | 331/17 |
| 2003/0080789 A1 * | 5/2003 | Caranana | 327/112 |
| 2006/0033529 A1 * | 2/2006 | Chauhan et al. | 326/81 |
| 2008/0246511 A1 * | 10/2008 | Miura et al. | 326/83 |
| 2009/0243665 A1 * | 10/2009 | Kumar et al. | 327/108 |

* cited by examiner

*Primary Examiner* — Lincoln Donovan
*Assistant Examiner* — Brandon S Cole

(57) ABSTRACT

A circuit includes a first current source, a second current source, a third current source and a fourth current source. A load includes a first terminal connected to a first node between the first current source and the second current source and a second terminal connected to a second node between the third current source and the fourth current source. A bias control module includes a first output configured to output a first bias signal to the first and fourth current sources and a second output configured to provide a second bias signal to the second and third current sources. A capacitance is connected to the first and second outputs of the bias control module.

19 Claims, 6 Drawing Sheets

US 8,354,874 B1

KICKBACK CANCELLATION IN CLASS B TYPE CIRCUITS USING AC COUPLING

CROSS-REFERENCE TO RELATED APPLICATIONS

This application claims the benefit of U.S. Provisional Application No. 61/178,696, filed on May 15, 2009. The disclosure of the above application is incorporated herein by reference in its entirety.

FIELD

The present disclosure relates to Class B type circuits, and more particularly to biasing and control of Class B type circuits.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Some circuits may be classified as type A, B, AB, G, etc. The classification of the circuit is based in part on a portion of the input signal cycle during which the circuit conducts.

In Class A type circuits, 100% of the input signal is used. Where efficiency is not a consideration, most small signal linear amplifiers are designed as Class A type circuits. While Class A type circuits are typically more linear and less complex than other circuit types, they are relatively inefficient.

Class B type circuits use 50% of the input signal. In most Class B type circuits, there are two output devices that conduct alternately during half cycles. Some distortion may occur in Class B type circuits. While distortion is usually worse at higher frequencies, distortion may also occur at lower frequencies due to kickback.

Referring now to FIG. 1, an exemplary Class B type circuit 10 is shown. The circuit 10 includes controllable current sources 12, 14, 16 and 18. During one half cycle, the current sources 12 and 18 supply current in a first direction across a load 20. During a second half cycle, the current sources 14 and 16 provide current across the load 20 in an opposite direction.

Current steering digital to analog coverters (DACs) implemented as Class B type circuits do not work in differential arrangements. As a result, a large kick-back is usually seen at a control terminal of current sources in Class B type circuits if there is not enough voltage headroom to use cascade devices, which can cause distortion.

SUMMARY

A circuit includes a first current source, a second current source, a third current source and a fourth current source. A load includes a first terminal connected to a first node between the first current source and the second current source and a second terminal connected to a second node between the third current source and the fourth current source. A bias control module includes a first output configured to output a first bias signal to the first and fourth current sources and a second output configured to provide a second bias signal to the second and third current sources. A capacitance is connected to the first and second outputs of the bias control module.

In other features, the bias control module includes a first bias circuit and a second bias circuit. A first switch and the first current source are connected between a voltage supply and the first node. A second switch and the second current source are connected between the first node and a reference potential. A third switch and the third current source are connected between the voltage supply and the second node. A fourth switch and the fourth current source are connected between the second node and the reference potential.

A circuit comprises a Class B type circuit including a first input, a second input, a first output and a second output. A bias control module includes a first output configured to output a first bias signal to the first input. A second output is configured to provide a second bias signal to the second input. A capacitance is connected to the first output and the second output of the bias control module.

In other features, a load is connected across the first output and the second output of the Class B type circuit. The bias control module includes a first bias circuit and a second bias circuit.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

The present disclosure will become more fully understood from the detailed description and the accompanying drawings, wherein.

DESCRIPTION

Figure 1:
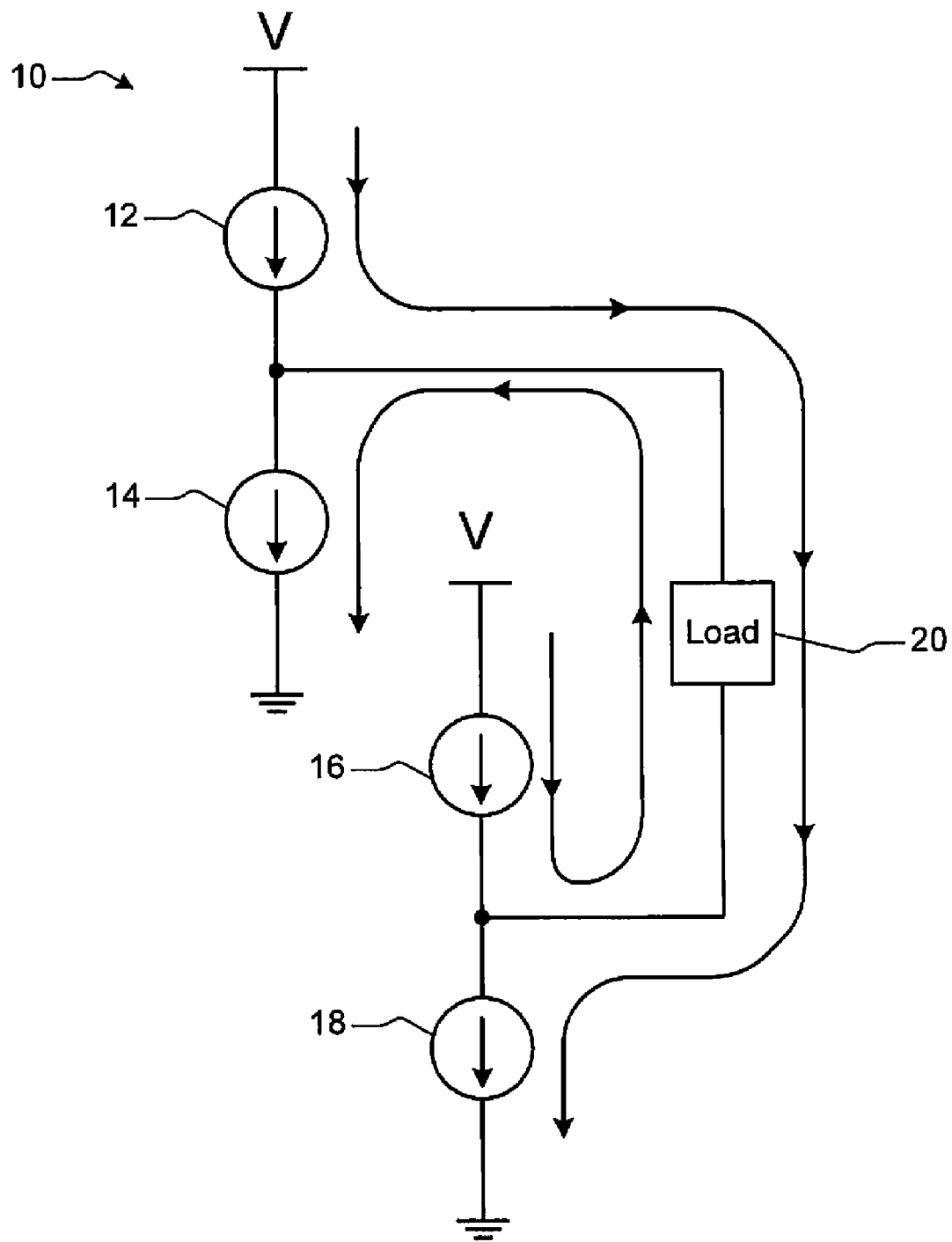
FIG. 1 is a functional block diagram and electrical schematic for a Class B type circuit according to the prior art.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical OR. It should be understood that steps within a method may be executed in different order without altering the principles of the present disclosure.

As used herein, the term module may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

Figure 2:
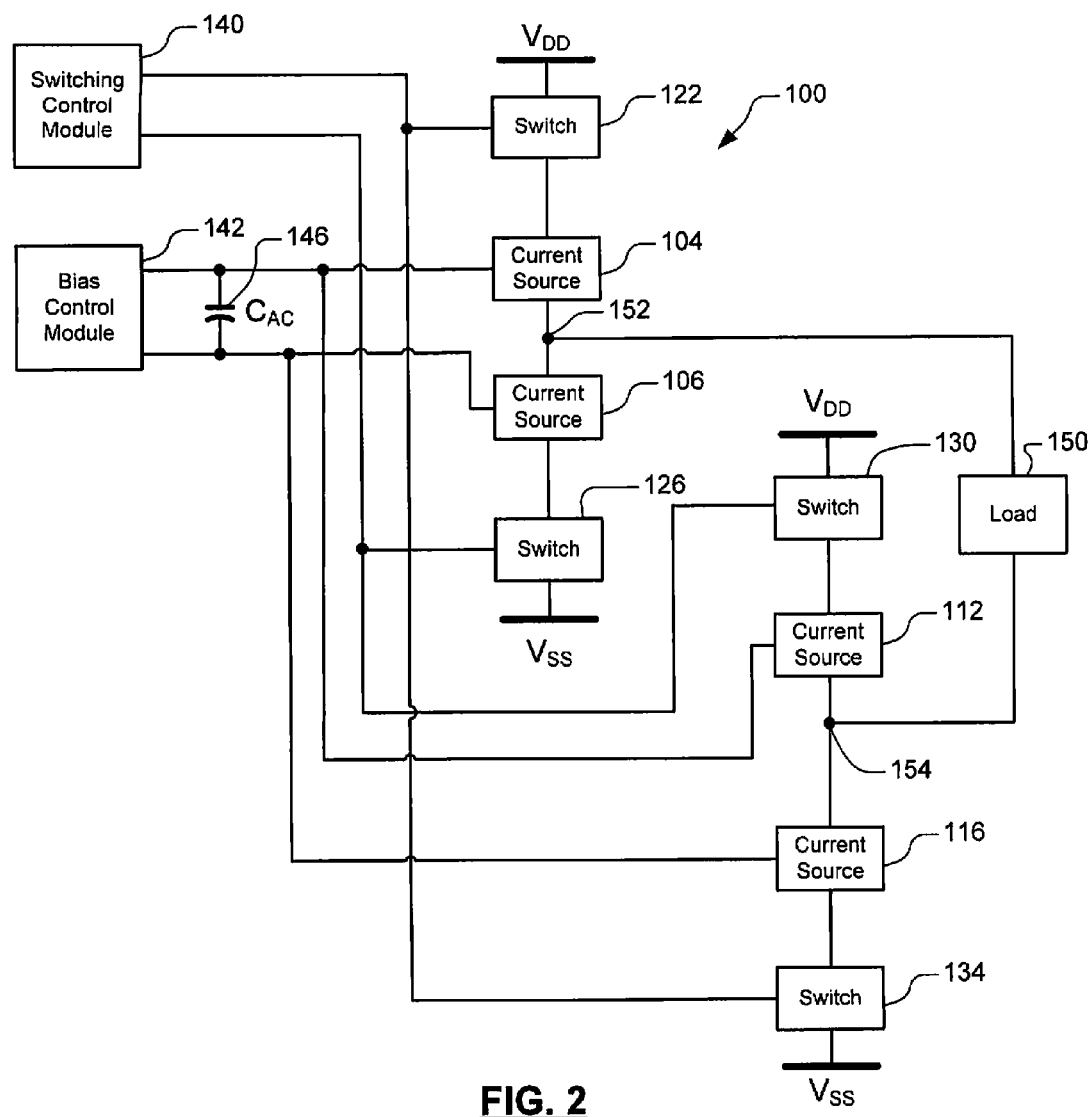
FIG. 2 is a functional block diagram and electrical schematic of a Class B type circuit according to the present disclosure.

Referring now to FIG. 2, a Class B type circuit 100 according to the present disclosure is shown. The circuit 100 includes current sources 104, 106, 112 and 116. The circuit 100 further includes switches 122, 126, 130 and 134 that switch the current sources 104, 106, 112 and 116, respectively, on and off to alternate a direction of the current across a load 150.

The circuit 100 includes a switching control module 140 that controls states of the switches 122, 126, 130 and 134. A bias control module 142 generates control signals for biasing control terminals of transistors associated with the current sources 104, 106, 112 and 116.

According to the present disclosure, AC coupling is provided between first and second outputs of the bias control module 142 to reduce kickback. More particularly, an AC coupling capacitor 146 is connected across first and second outputs of the bias control module 142.

A load 150 has a first terminal connected to a first node 152 between the current sources 104, 106 and has a second terminal connected to a second node 154 between the current sources 112, 116. The circuit 100 provides current across the load 150 in a first direction during a first-half cycle and in an opposite direction during a second-half cycle.

In more detail, the switch 122 and the current source 104 are connected between a voltage supply $V_{DD}$ and the first node 152. The current source 106 and the switch 126 are connected between the first node 152 and a reference potential $V_{SS}$ such as ground. The switch 130 and the current source 112 are connected between the voltage supply $V_{DD}$ and the second node 154. The current source 116 and the switch 134 are connected between the second node 154 and the reference potential $V_{SS}$.

In use, the current sources 104, 106, 112 and 116 are constantly biased during operation. The switches 122 and 134 are selectively turned on and off while the switches 126 and 130 are off and vice versa. In other words, current flows during one half cycle from the switch 122 and the current source 104 to the load 150 and to the current source 116 and the switch 134. Subsequently during the next half cycle, current flows from the switch 130 and the current source 112 to the load 150 and to the current source 106 and the switch 126.

In class-B type circuits, when the switches are turned on or off to generate current in one direction, the switches that control the supply of current in the opposite direction are always off. For example in FIG. 2, switches 122 and 134 are turned on and off to generate or stop current flow in first direction while switches 126 and 130 remain off. When switches 126 and 130 are active (turning on/off together), switches 122 and 134 remain off.

During operation, kickback at control terminals of the current sources 104, 106, 112 and 116 tends to occur. Kickback at the current source 104 is approximately opposite in magnitude to that experienced at the current source 116. A similar situation exists for current sources 106 and 112 when the switches 126 and 130 transition from on to off, or from off to on. Placement of the AC coupling capacitor 146 across the control terminals of the current sources 104 and 116 and the control terminals of the current sources 106 and 112 tends to reduce distortion by canceling the kickback.

Figure 3:
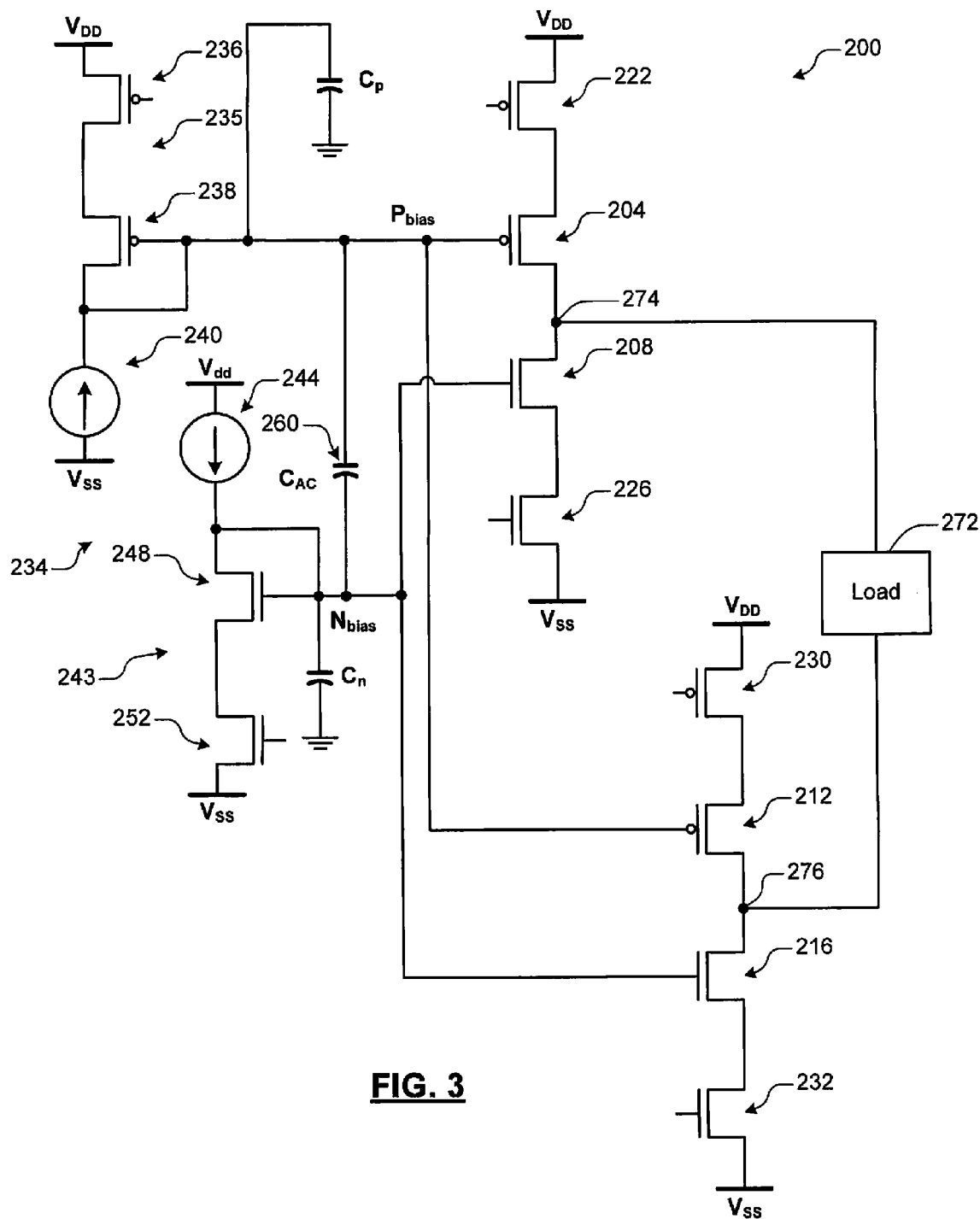
FIG. 3 is a functional block diagram and electrical schematic of another Class B type circuit according to the present disclosure.

Referring now to FIG. 3, another Class B type circuit 200 according to the present disclosure is shown. The circuit 200 includes current sources 204, 208, 212 and 216. The circuit 200 further includes switches 222, 226, 230 and 232. While the switching control module is omitted in FIG. 3, the switching control module may be provided to control states of the switches 222, 226, 230 and 232.

A bias control module 234 includes a first biasing circuit 235 and a second biasing circuit 243. The first biasing circuit 235 generates control signals for biasing control terminals of transistors of the current sources 204 and 212. The second biasing circuit 243 generates control signals for biasing control terminals of transistors of the current sources 208 and 216.

The first biasing circuit 235 includes a first transistor 236, a second transistor 238 and a current source 240. A first terminal of the transistor 236 is connected to the voltage supply $V_{DD}$. A second terminal of the transistor 236 is connected to a first terminal of the second transistor 238. A second terminal of the transistor 238 is connected to a current source 240 and to a control terminal of the second transistor 238. The control terminal of the second transistor 238 supplies a first bias signal to control terminals of transistors of the current sources 204 and 212.

The second biasing circuit 243 includes a first transistor 252, a second transistor 248 and a current source 244. A second terminal of the first transistor 252 is connected to the reference potential $V_{SS}$. A first terminal of the first transistor 252 is connected to a second terminal of the second transistor 248. A first terminal of the second transistor 248 is connected to the current source 244 and to a control terminal of the second transistor 248. The control terminal of the second transistor 248 supplies a second bias signal to control terminals of transistors of the current sources 208 and 216.

AC coupling is provided between outputs of the bias control module 234 to reduce kickback according to the present disclosure. More particularly, AC coupling capacitor 260 is connected across first and second outputs of the bias control module 234. A load 272 is connected to a first node 274 between the current sources 204 and 208 and to a second node 276 between the current sources 212 and 216. The circuit 200 provides current across the load 272 in a first direction during a first-half cycle and in an opposite direction during a second-half cycle.

In more detail, the switch 222 and the current source 204 are connected between a voltage supply $V_{DD}$ and the first node 274. The current source 208 and the switch 226 are connected between the first node 274 and a reference potential $V_{SS}$. The switch 230 and the current source 212 are connected between the voltage supply $V_{DD}$ and the second node 276. The current source 216 and the switch 232 are connected between the second node 276 and the reference potential $V_{SS}$.

Parasitic capacitance $C_p$ may be present at the control terminal of the second transistor 238 of the first biasing circuit 235. Parasitic capacitance $C_n$ may also be present at the control terminal of the second transistor 248 of the second biasing circuit 243.

In use, the current sources 204, 208, 212 and 216 are constantly biased during operation. The switches 222 and 232 are selectively turned on and off while the switches 226 and 230 remain off and vice versa. In other words, current flows during one half cycle from the switch 222 and the current source 204 to the load 272 and to the current source 216 and the switch 232. Subsequently during the next half cycle, current flows from the switch 230 and the current source 212 to the load 272 and to the current source 208 and the switch 226. When creating a sinusoidal or other type of output in class-B type circuits, a first half cycle is generated by sequentially turning on/off the switches that control current in one direction while keeping the switches that control current in the opposite direction off.

As a result of the switches 222 and 226 and 230 and 232 being switched in the alternating pattern described above and below, kickback experienced at control terminals of the current sources 204 and 216 and 208 and 212 occurs, respectively. The kickback at the current source 204 is approximately opposite in magnitude to that experienced at the control terminals of the current source 216. The kickback at the current source 208 is approximately opposite in magnitude to that experienced at the control terminals of the current source 212. As a result, placement of the AC coupling capacitor 260 across the control terminals of the current sources 204 and 216 and the control terminals of the current sources 208 and 212 tends to improve distortion by canceling the kickback.

In some implementations, the transistors 204, 212, 222, 230, 236 and 238 are P-type metal oxide semiconductor field effect transistors (MOSFET). In some implementations, the transistors 208, 216, 226, 232, 248 and 252 are N-type MOSFET transistors.

In class-B type push-pull circuits such as DACs, kick-back at the P-type current source bias node (designated as $P_{bias}$ in FIG. 3) is opposite to kick-back at N type current source bias node (designated as $N_{bias}$ in FIG. 3). The amplitude of kick-back at the P-type current sources is $K_p$. The amplitude of kick-back at the N-type current sources is $(-K_n)$, where $K_p$ and $K_n > 0$. Using an AC-coupling capacitor ($C_{AC}$), the kick-back at P-type current sources can be reduced to:

$$|K_P| - \left(\frac{C_{AC}}{C_{AC} + C_p}\right) * |K_n|,$$

where $C_P$ is the parasitic capacitance from the gate of P-type current sources to the supply. The same is true for N-type current sources, where kick-back is reduced to:

$$|K_n| - \left(\frac{C_{AC}}{C_{AC} + C_n}\right) * |K_p|,$$

where $C_n$ is the parasitic capacitance from gates of N-type current sources to the ground.

As can be appreciated, the present disclosure reduces kick-back and distortion utilizing AC coupling. While it is anticipated that the AC coupling described herein may provide approximately 10 dB of improvement in distortion, other applications may experience more or less improvement. The load can be any type of impedance including resistors, capacitors, inductors and combinations thereof.

Figure 4:
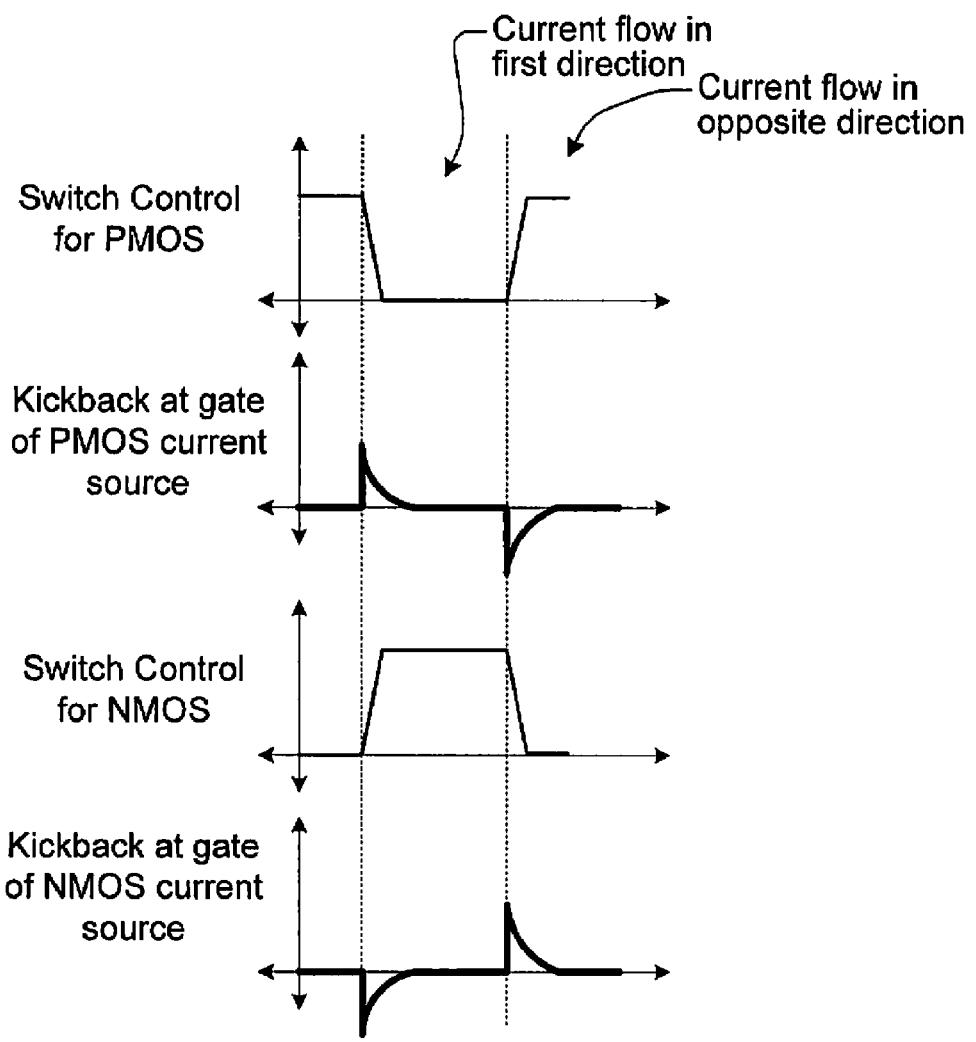
FIG. 4 is a graph showing switch control signals and kickback signals.

Referring now to FIG. 4, switch control signals and kick-back signals are shown. When the switch control signals for the PMOS transistor 222 goes low and the NMOS transistor 232 goes high, there is kickback at the gate of the PMOS transistor 204 and the NMOS transistor 216. When the switch control signals for the PMOS transistor 230 goes high and the NMOS transistor 226 goes low, there is kickback at the gate of the PMOS transistor 212 and the NMOS transistor 208.

Figure 5:
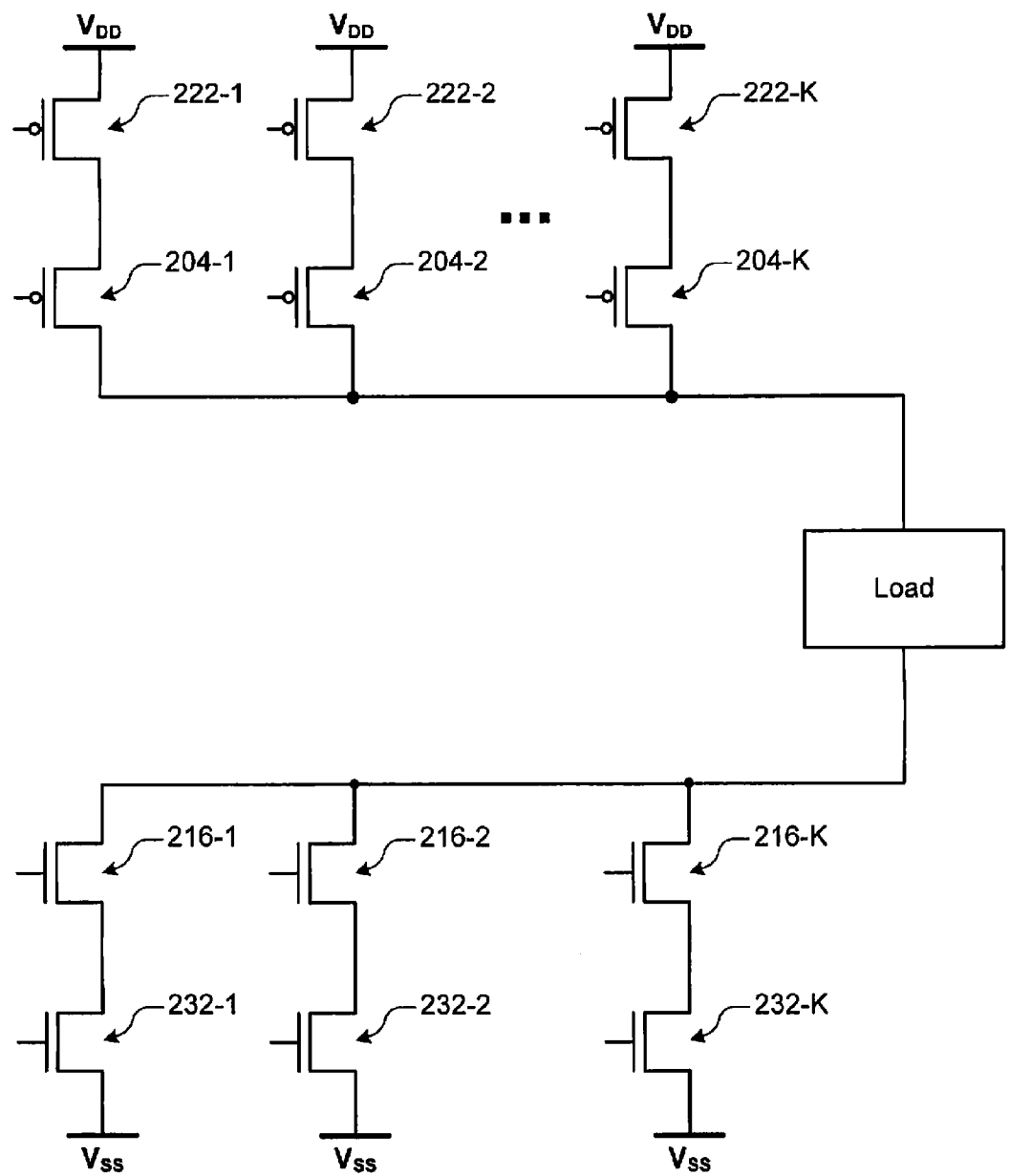
FIG. 5 is a functional block diagram and electrical schematic of a portion of another Class B type circuit according to the present disclosure.

Referring now to FIG. 5, in some implementations the transistors may include multiple transistors. For example, the transistors 204 and 222 in FIG. 3 may comprise transistors 204-1, 204-2, . . . , and 204-K and 222-1, 222-2, . . . , and 222-K, respectively. K is an integer greater than one. Likewise, the transistors 216 and 232 in FIG. 3 may comprise transistors 216-1, 216-2, . . . , and 216-K and 232-1, 232-2, . . . , and 232-K, respectively. The transistors 208 and 226 and 212 and 230 may be implemented in an analogous manner.

Figure 6:
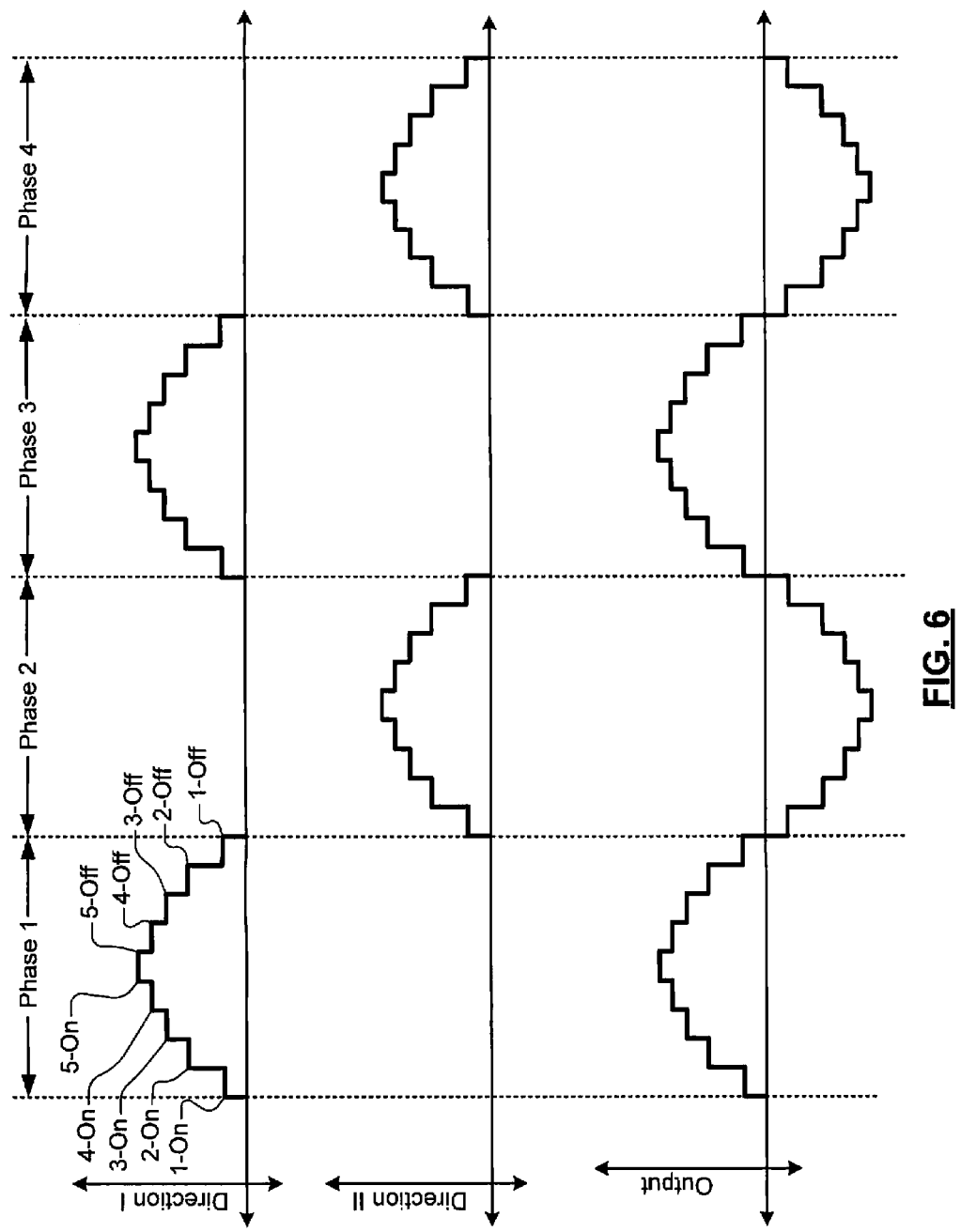
FIG. 6 includes graphs illustrating current output.

Referring now to FIG. 6, graphs illustrating current output to generate a sinusoidal waveform are shown. In this example implementation, K=5. The current sources (204, 208, 212 and 216) are biased on. The switches 226 and 230 are off during Phase 1 and Phase 3. The switches 222 and 232 are off during Phase 2 and 4.

During Phase 1, switches 222-1, 222-2, . . . , 222-5 and 232-1, 232-2, . . . , and 232-5 are sequentially turned on and then sequentially turned off. For example, the switches can be turned off in reverse order although other approaches may be used in a particular application. This approach generates a stepped current waveform (having a sinusoidal shape) in a first direction during Phases 1 and 3 as shown. The other switches 230 and 226 are operated in a similar manner during Phases 2 and 4 to generate a stepped current waveform (having a sinusoidal shape) in a second direction.

As can be appreciated, the output sees a generally sinusoidal output as shown. Other output waveforms may be generated, different timing may be used and/or additional or fewer transistors can be used in other implementations.

The broad teachings of the disclosure can be implemented in a variety of forms. Therefore, while this disclosure includes particular examples, the true scope of the disclosure should not be so limited since other modifications will become apparent upon a study of the drawings, the specification, and the following claims.

What is claimed is:
1. A cancellation circuit comprising:
   a first current source;
   a second current source;
   a third current source;
   a fourth current source;
   a load including
      a first terminal connected to a first node between the first current source and the second current source, and
      a second terminal connected to a second node between the third current source and the fourth current source;
   a bias control module including
      a first output configured to output a first bias signal to each of the first current source and the fourth current source, and
      a second output configured to output a second bias signal each of to the second current source and the third current source;
   a first capacitance connected to each of the first output of the bias control module and the second output of the bias control module;
   a second capacitance connected between (i) the first current source and the third current source, and (i) a ground reference;
   a third capacitance connected between (i) the second current source and the fourth current source, and (ii) the ground reference;
   a first switch, wherein the first switch and the first current source are connected between a voltage supply and the first node;
   a second switch, wherein the second switch and the second current source are connected between the first node and a reference potential;
   a third switch, wherein the third switch and the fourth current source are connected between the voltage supply and the second node;
   a fourth switch, wherein the fourth switch and the third current source are connected between the second node and the reference potential; and
   a switching control module configured to control (i) states of the first switch and the fourth switch via a first control signal, and (ii) states of the second switch and the third switch via a second control signal.
2. The cancellation circuit of claim 1, wherein the bias control module includes a first bias circuit and a second bias circuit.

3. The cancellation circuit of claim 2, wherein the first bias circuit includes:
  a bias current source;
  a first transistor including a first terminal connected to the voltage supply; and
  a second transistor including
    a first terminal connected to a second terminal of the first transistor, and
    a second terminal connected to (i) a control terminal of the second transistor, and (ii) the bias current source.

4. The cancellation circuit of claim 3, wherein:
  the first current source and the fourth current source comprise P-type MOSFET transistors; and
  the first transistor and the second transistor comprise P-type MOSFET transistors.

5. The cancellation circuit of claim 2, wherein the second bias circuit includes:
  a bias current source;
  a first transistor including a first terminal connected to (i) the bias current source, and (ii) a control terminal of the first transistor; and
  a second transistor including a first terminal connected to a second terminal of the first transistor.

6. The cancellation circuit of claim 5, wherein:
  the first current source and the fourth current source comprise N-type transistors; and
  the first transistor and the second transistor comprise N-type MOSFET transistors.

7. The cancellation circuit of claim 1, wherein the bias control module comprises:
  a first bias circuit comprising
    a first transistor comprising
      a first terminal connected to the voltage supply, and
      a second terminal,
    a second transistor comprising
      a first terminal connected to the second terminal of the first transistor,
      a control terminal connected to the first current source and the third current source, and
      a second terminal connected to the control terminal of the second transistor, and
    a fifth current source connected to (i) the control terminal of the second transistor, and (ii) the second terminal of the second transistor; and
  a second bias circuit comprising
    a sixth current source connected to the voltage supply,
    a third transistor comprising
      a first terminal connected to the sixth current source,
      a control terminal connected to (i) the first terminal of the third transistor, (ii) the second current source, and (iii) the fourth current source, and
      a second terminal, and
    a fourth transistor comprising a first terminal connected to the second terminal of the third transistor.

8. The cancellation circuit of claim 7, wherein:
  the second capacitance is connected between the control terminal of the second transistor and a ground reference; and
  the third capacitance is connected between the control terminal of the third transistor and the ground reference.

9. The cancellation circuit of claim 1 further comprising:
  a P-type bias node between (i) a first bias circuit, and (ii) the first current source and the third current source, wherein a first kick-back voltage at the P-type bias node is based on the first capacitance and the second capacitance; and
  an N-type bias node between (i) a second bias circuit, and (ii) the second current source and fourth current source, wherein a second kick-back voltage at the N-type bias node is based on the first capacitance and the third capacitance.

10. A cancellation circuit comprising:
  a Class B type circuit including a first input, a second input, a first output, and a second output;
  a bias control module including
    a first output configured to output a first bias signal to the first input, and
    a second output configured to provide a second bias signal to the second input;
  a first bias circuit comprising
    a first transistor comprising
      a first terminal connected to a voltage supply, and
      a second terminal,
    a second transistor comprising
      a first terminal connected to the second terminal of the first transistor,
      a control terminal connected to a first current source and a second current source, and
      a second terminal connected to the control terminal of the second transistor, and
    a third current source connected to (i) the control terminal of the second transistor, and (ii) the second terminal of the second transistor; and
  a second bias circuit comprising
    a fourth current source connected to the voltage supply,
    a third transistor comprising
      a first terminal connected to the fourth current source,
      a control terminal connected to (i) the first terminal of the third transistor, (ii) a fifth current source, and (iii) a sixth current source, and
      a second terminal, and
    a fourth transistor comprising a first terminal connected to the second terminal of the third transistor;
  a capacitance connected to (i) the first output of the bias control module, and (ii) the second output of the bias control module;
  a first switch connected between the voltage supply and the first output;
  a second switch connected between the first output and a reference potential;
  a third switch connected between the voltage supply and the second output;
  a fourth switch connected between the second output and the reference potential; and
  a switching control module configured to control (i) states of the first switch and the fourth switch via a first control signal, and (ii) states of the second switch and the third switch via a second control signal.

11. The cancellation circuit of claim 10, further comprising a load connected to (i) the first output of the Class B type circuit, and (ii) the second output of the Class B type circuit.

12. The cancellation circuit of claim 10, wherein the Class B type circuit comprises:
  the first switch connected to the first current source;
  the second switch connected to the second current source;
  the third switch connected to the third current source; and
  the fourth switch connected to the fourth current source.

13. The cancellation circuit of claim 12, wherein:
  the first output of the Class B type circuit is connected to the first current source and the second current source; and the second output of the Class B type circuit is connected to the third current and the fourth current source.

14. The cancellation circuit of claim 13, wherein:
the first current source (i) is configured to receive the first bias signal, and (ii) is connected between the voltage supply and a first node;
the second current source (i) is configured to receive the second bias signal, and (ii) is connected between the first node and the reference potential;
the third current source (i) is configured to receive the second bias signal, and (ii) is connected between the voltage supply and a second node; and
the fourth current source (i) is configured to receive the first bias signal, and (ii) is connected between the second node and the reference potential.

15. The cancellation circuit of claim 12 wherein:
the first current source and the fourth current source comprise P-type MOSFET transistors; and
the first transistor and the second transistor comprise P-type MOSFET transistors.

16. The cancellation circuit of claim 12, wherein:
the first current source and the fourth current source comprise N-type MOSFET transistors; and
the first transistor and the second transistor comprise N-type MOSFET transistors.

17. A cancellation circuit comprising:
a Class B type circuit including a first input, a second input, a first output and a second output;
a bias control module comprising
   a first output configured to output a first bias signal to the first input,
   a second output configured to provide a second bias signal to the second input,
   a first bias circuit comprising
     a first control terminal connected to the first input of the Class B type circuit, and
     a first capacitance connected between (i) the first input of the Class B type circuit, and (i) a ground reference, and
   a second bias circuit (i) separate from the first bias circuit, and (ii) comprising
     a second control terminal connected to the second input of the Class B type circuit, and
     a second capacitance connected between (i) the second input of the Class B type circuit, and (ii) the ground reference; and
a third capacitance connected to (i) the first output of the bias control module, and (ii) the second output of the bias control module.

18. The circuit of claim 17, wherein:
the first capacitance configured to direct current from the first output of the bias control module to the ground reference; and
the second capacitance configured to direct current from the second output of the bias control module to the ground reference.

19. The circuit of claim 17, wherein:
the first bias circuit comprises
   a first transistor comprising
     a first terminal connected to a voltage supply, and
     a second terminal,
   a second transistor comprising
     a first terminal connected to the second terminal of the first transistor,
     the first control terminal, and
     a second terminal connected to the control terminal of the second transistor, and
   a first current source connected to (i) the control terminal of the second transistor, and (ii) the second terminal of the second transistor; and
the second bias circuit comprises
   a second current source connected to the voltage supply,
   a third transistor comprising
     a first terminal connected to the second current source,
     the second control terminal connected to the first terminal of the third transistor, and
     a second terminal, and
   a fourth transistor comprising a first terminal connected to the second terminal of the third transistor.

* * * * *